(12) United States Patent
Naderi

(10) Patent No.: US 11,934,242 B2
(45) Date of Patent: Mar. 19, 2024

(54) INTELLIGENT DATA CENTER INCLUDING N INDEPENDENT COOLABLE CLUSTERS HAVING RESPECTIVE ACTUAL POWER DEMAND (P ac) ADJUSTABLE AT, ABOVE OR BELOW AN OSTENSIBLE POWER DEMAND (P os)

(71) Applicant: Nvidia Corporation, Santa Clara, CA (US)

(72) Inventor: Alex R. Naderi, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 142 days.

(21) Appl. No.: 17/103,413

(22) Filed: Nov. 24, 2020

(65) Prior Publication Data

US 2021/0176898 A1    Jun. 10, 2021

Related U.S. Application Data

(60) Provisional application No. 62/945,205, filed on Dec. 8, 2019.

(51) Int. Cl.
*G06F 1/26* (2006.01)
*G06F 1/20* (2006.01)
(Continued)

(52) U.S. Cl.
CPC .............. *G06F 1/26* (2013.01); *G06F 1/206* (2013.01); *G06F 1/30* (2013.01); *H05K 7/20236* (2013.01);
(Continued)

(58) Field of Classification Search
CPC .......... H05K 7/20736; H05K 7/20781; H05K 7/20818; H05K 7/20836; H05K 7/20236; H05K 7/1488; H05K 7/1492; H05K 7/20272; H05K 7/20281; H05K 7/20745; H05K 7/20763; G06F 1/206; G06F 1/26; G06F 1/28; G06F 1/30; G06F 2200/201; G06F 1/189
See application file for complete search history.

(56) References Cited

U.S. PATENT DOCUMENTS 9,250,684 B1 *   2/2016   Chen ................. G06F 1/3206
2007/0038414 A1 *   2/2007   Rasmussen ............. G06F 30/13
703/1

(Continued)

*Primary Examiner* — Chun Cao

(57) ABSTRACT

Provided, in one aspect, is a data center. The data center, in this aspect, includes a data center enclosure, the data center enclosure designed for a given supply of power ($P_s$). The data center, according to this aspect, further includes N independent coolable clusters of data center racks located within the data center enclosure, wherein N is at least two, and further wherein the N independent coolable clusters each have an ostensible power demand ($P_{os}$) approximately equal to $P_s/N$, and each of the N independent coolable clusters has a respective actual power demand ($P_{ac}$) adjustable at, above or below the ostensible power demand ($P_{os}$).

20 Claims, 5 Drawing Sheets

(51) Int. Cl.
*G06F 1/30* (2006.01)
*H05K 7/20* (2006.01)
(52) U.S. Cl.
CPC ..... *H05K 7/20736* (2013.01); *H05K 7/20781* (2013.01); *H05K 7/20818* (2013.01); *H05K 7/20836* (2013.01)

(56) References Cited

U.S. PATENT DOCUMENTS

| | | | | |
|---|---|---|---|---|
| 2007/0186121 A1* | 8/2007 | Yasuo | .................... | G06F 1/3203 713/320 |
| 2008/0093927 A1* | 4/2008 | Ewing | .................. | H05K 7/1492 307/23 |
| 2011/0077795 A1* | 3/2011 | VanGilder | ............... | G06F 1/206 700/300 |
| 2011/0144818 A1* | 6/2011 | Li | ............................. | G06F 1/26 700/291 |
| 2013/0226362 A1* | 8/2013 | Jagadishprasad | ..... | G06F 1/3203 700/297 |
| 2013/0318371 A1* | 11/2013 | Hormuth | ............. | G06F 11/3062 713/320 |
| 2015/0121113 A1* | 4/2015 | Ramamurthy | ...... | H02J 7/00712 713/340 |
| 2020/0089298 A1* | 3/2020 | Lin | ..................... | G06F 11/3058 |
| 2020/0106297 A1* | 4/2020 | Ross | .................... | G05B 19/054 |

* cited by examiner

INTELLIGENT DATA CENTER INCLUDING N INDEPENDENT COOLABLE CLUSTERS HAVING RESPECTIVE ACTUAL POWER DEMAND (P ac) ADJUSTABLE AT, ABOVE OR BELOW AN OSTENSIBLE POWER DEMAND (P os)

CROSS-REFERENCE TO RELATED APPLICATION

This application claims the benefit of U.S. Provisional Application Ser. No. 62/945,205, filed on Dec. 8, 2019, entitled "GPU DATA CENTER," commonly assigned with this application and incorporated herein by reference.

TECHNICAL FIELD

At least one embodiment of the disclosure is directed, in general, to data centers and, more specifically, to designing, manufacturing and employing fungible data centers for use in a variety of power (e.g., high, low and everything in between) applications.

BACKGROUND

Many organizations use large scale computing facilities, such as data centers, in their business. These data centers traditionally include large unencumbered rooms full of dozens of data center rack enclosures, each data center rack enclosure housing different electronic components, including the processors/data servers, network equipment, and computer equipment necessary to process, store, and exchange data as needed to carry out an organization's operations. Unfortunately, today's data centers are not designed to efficiently handle the ever increasing and continually changing power demand of the electronic components located within the data center rack enclosures.

BRIEF DESCRIPTION

Reference is now made to the following descriptions taken in conjunction with the accompanying drawings, in which.

DETAILED DESCRIPTION

Figure 1:
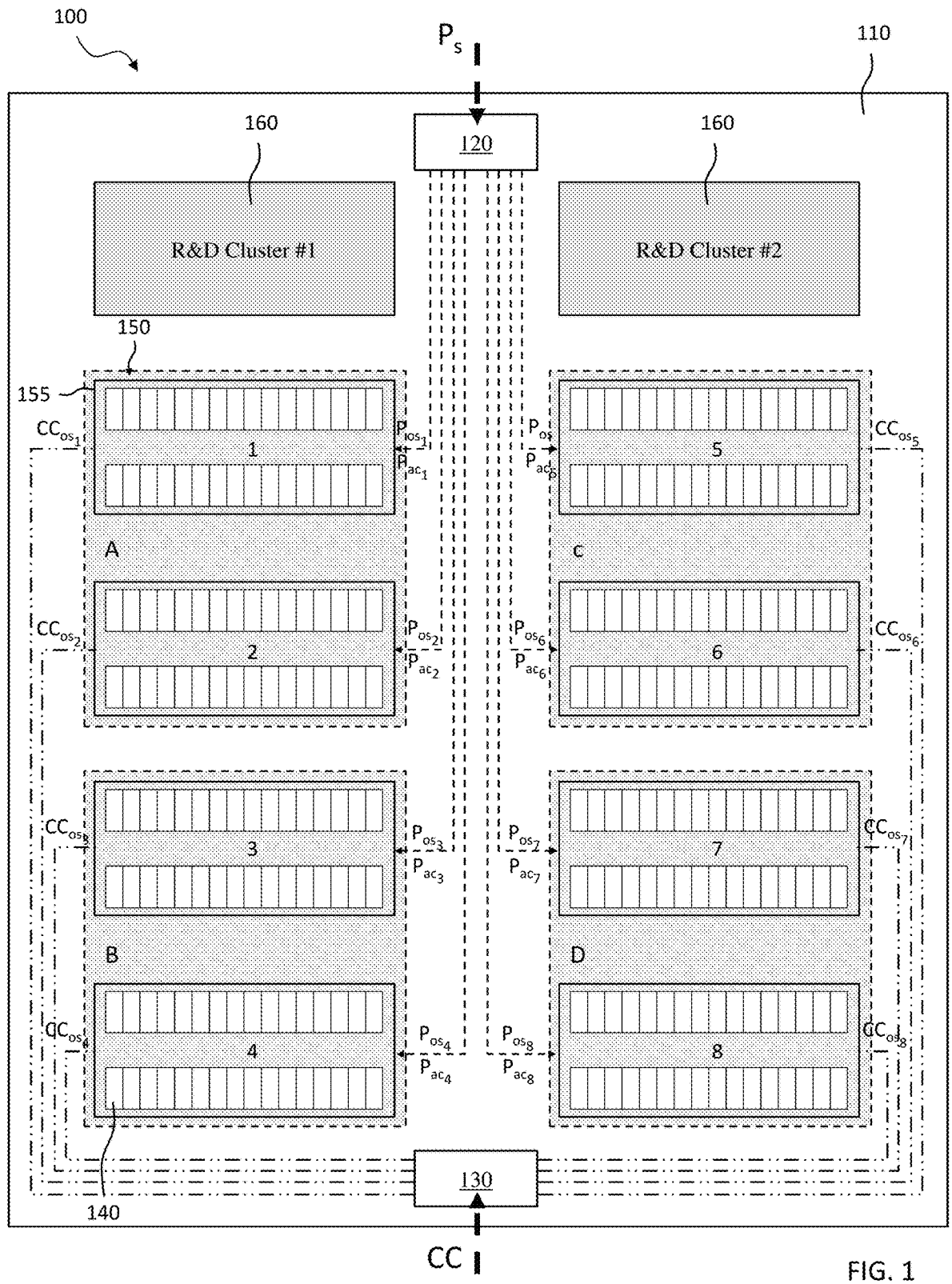
FIG. 1 illustrates a data center designed, manufactured and operated to one or more embodiments of the disclosure.

Traditional data centers are homogenous in nature, meaning that a single unencumbered data center enclosure is full of dozens upon dozens (if not hundreds upon hundreds) of similarly, if not identically, configured data center racks of electronic equipment. For instance, each of the racks might include a fixed number of processing equipment (e.g., data servers), storage equipment and network equipment, likely configured in a desired manner within the rack, which is commonly reproduced time and time again across many, if not all, of the data center racks within the data center enclosure. Given the foregoing, each of the data center racks within the traditional data center enclosure has very similar, if not identical, power requirements and heat dissipation requirements.

Accordingly, traditional data centers tend to be designed such that each data center rack within the data center enclosure equally shares the resources of the data center. Specifically, traditional data centers are designed for a given supply of power ($P_s$) and a given cooling capacity (CC), and each data center rack within the data center receives its approximately equal allotment of the given supply of power ($P_s$) and the given cooling capacity (CC). As a non-limiting example, one traditional data center might include 128 operable data center racks, at 2× redundancy. Thus, in the traditional sense, each of the 128 operable data center racks would receive its approximately equal $1/128^{th}$ of the given supply of power ($P_s$) and its approximately equal $1/128^{th}$ of the given cooling capacity (CC), or at least very close thereto.

It is envisioned that data centers will become less repetitive over time, and thus certain data center racks and/or collections of data center racks will require more (or less) than their approximately equal allotment of the given supply of power ($P_s$) and/or given cooling capacity (CC), than say another data center rack or collection of data center racks within the same data center enclosure. To accommodate these ever increasing requirements, all the while manufacturing a data center that has a suitable lifespan, traditional data center were over designed to accommodate the highest conceivable power and/or cooling capacity needed. Unfortunately, over designed data centers are not only expensive to manufacture, but in the general use case, are incredibly inefficient and expensive to operate—as much of the given supply of power ($P_s$) and given cooling capacity (CC) goes unused. In fact, studies have shown that over designed data centers leave a significant amount of the resources stranded.

As such, the present disclosure seeks to protect a fungible data center design, wherein the fixed resources of the data center (e.g., including without limitation power, cooling capacity, etc.), which were traditionally approximately equally allotted amongst the data center racks within the data center enclosure, may be moved (or at least partially moved) from one data center rack to another, or alternatively from one cluster of data center racks to another cluster of data center racks. In at least one embodiment, such a movement of the fixed resources of the data center amongst data center racks or clusters of data center racks may be performed without little and/or any real time physical reconfiguration of the data center design.

Accordingly, a data center according to at least one embodiment of the disclosure includes multiple degrees of freedom (e.g., three degrees of freedom in one example). For example, a data center designed, manufactured and operated according to the disclosure could include the ability to vary the given supply of power ($P_s$) and/or given cooling capacity (CC) of the data center enclosure as a whole, the ability to vary the allotted respective amounts of the given supply of power ($P_s$) and/or given cooling capacity (CC) amongst clusters of data center racks in relation to other clusters of data center racks, and the ability to vary the allotted respective amounts of the given supply of power ($P_s$) and/or given cooling capacity (CC) amongst individual racks (e.g., whether within a given cluster of racks or outside a given cluster of racks) in relation to other individual data center racks.

Turning to FIG. 1, illustrated is a data center 100 designed, manufactured and operated according to one or more embodiments of the disclosure. The data center 100 includes many of the benefits, including the fungible nature and the many degrees of freedom, as discussed above. The data center 100, in the illustrated embodiment, includes a data center enclosure 110. The data center enclosure 110, in one embodiment, is a single floor of a building. In an alternative embodiment, the data center enclosure 110 is a portion of a single floor of a building, or alternatively two or more floors of a building. In yet another embodiment, the data center enclosure 110 is a mobile data center. Notwithstanding the foregoing, a data center enclosure 110 according to the present disclosure may be designed for a given supply of power ($P_s$) and/or given cooling capacity (CC).

In at least one embodiment, the given supply of power ($P_s$) enters the data center enclosure 110 and goes into a power distribution element 120. The power distribution element 120 may be any element and/or component that helps distribute the given supply of power ($P_s$) of the data center 100 to the various electronics within the data center enclosure 110. In certain embodiments, the power distribution element 120 includes a plurality of adjustable circuit breakers (e.g., an adjustable circuit breaker dedicated for each of the N independently coolable clusters, for example for limiting the actual power demand ($P_{ac}$) of one of the N independently coolable clusters to assure that it is below the ostensible power demand ($P_{os}$), while not limiting another of the N independently coolable clusters to allow it to be above the ostensible power demand ($P_{os}$), to keep a sum of the actual power demands ($P_{ac}$) for the N independent coolable clusters at or below the given supply of power ($P_s$)). In at least one embodiment, the given cooling capacity (CC) enters the data center enclosure 110 and goes into a cooling distribution element 130. The cooling distribution element 130 may be any element and/or component that helps distribute the given cooling capacity (CC) to the various electronics within the data center enclosure 110. While the cooling distribution element 130 is illustrated at the data center enclosure 110 level, other embodiments may exist wherein multiple cooling distribution elements 130 are located within the data center enclosure (e.g., a cooling distribution element 130 dedicated for each of the N independently coolable clusters). Furthermore, the cooling distribution element 130 is not limited to only distributing the product of air-based cooling systems, but could also be used to distribute the product of liquid-based cooling systems, including cold plate single phase cooling systems, cold plate two phase cooling systems, or immersion cooling systems. Furthermore, the cooling distribution element 130 is not limited to distributing the product of any single type of cooling system, but could be used to distribute the product of multiple types of cooling systems, including those systems described above. The cooling distribution element 130 is capable of sophisticated control of the coolants, independently or concurrently, in the data center enclosure 110. For instance, the cooling distribution element 130 may be adapted to control the temperature, pressure or flow rate, among others, so that the coolant(s) is appropriately distributed to extract heat generated within the data center racks of the data center enclosure 110.

In at least one embodiment, the data center enclosure 110 includes a plurality of data center racks 140. The specific number of data center racks 140 within a given data center enclosure 110 may vary greatly from data center 100 design to data center design 100, as well as the application of the data center 100. Nevertheless, typical data centers 100 include dozens upon dozens of data center racks 140, if not more than a hundred data center racks 140.

In accordance with at least one embodiment, the plurality of data center racks 140 are separated into N independently coolable clusters 150 of data center racks 140. In the embodiment of FIG. 1, the plurality of data center racks 140 have been separated into eight (8) independently coolable clusters 150 of data center racks 140 (e.g., clusters 1-8), for example by placing the eight (8) independently coolable clusters 150 in eight (8) separate enclosures and/or rooms 155. Other embodiments are envisioned where N is at least four (4), and each of the at least four (4) independent coolable clusters 150 includes at least 8 data center racks 140, among other configurations. The enclosures and/or rooms 155 may take on many different configurations and remain within the scope of the disclosure. What optimally results, in at least one embodiment, is partial and/or complete local thermal isolation of the eight (8) independently coolable clusters 150 from one another.

In at least one embodiment, the eight (8) independently coolable clusters 150 may be arranged into pairs. In the illustrated embodiment, what results are four (4) separate Quads (e.g., A, B, C and D). In at least one embodiment, the four (4) separate Quads are four (4) separately controllable Quads. In at least one embodiment, Quad A includes the first and second (e.g., 1 and 2) independently coolable clusters 150, Quad B includes the third and fourth (e.g., 3 and 4) independently coolable clusters 150, Quad C includes the fifth and sixth (e.g., 5 and 6) independently coolable clusters 150, and Quad D includes the seventh and eighth (e.g., 7 and 8) independently coolable clusters 150.

Each of the data center racks 140, in accordance with at least one embodiment, include various different types and amounts of electronic equipment requiring power, including any number of various different types of processing equipment (e.g., also referred to as data servers), storage equipment, network equipment and power distribution unit(s), among others. In at least one embodiment, the various different types and amounts of electronic equipment may be used to provide the Floating Point Operations per Second (FLOPS) needed for high performance computing, such as may be necessary for artificial intelligence (AI) applications. In at least one embodiment, the various different types and amounts of electronic equipment can be used to provide the storage and networking needed to support the large-scale deep neural network (DNN) training that powers software development for autonomous vehicles, internal AI for companies, and robotics development, among others. In at least one embodiment, the various different types and amounts of electronic equipment can be used with reactive machines, autonomous machines, self-aware machines, and self-learning machines that all require a massive compute intensive server infrastructure and computing power.

In at least one embodiment, the processing equipment can be parallel processing units, such as graphics processing units (GPUs), or serial processing units, such as central processing units (CPUs). In at least one embodiment, the processing equipment can also be other types of circuits having at least a portion of the processing capabilities of a GPU or CPU. In at least one embodiment, the processing equipment can be, for example, application-specific integrated circuits (ASICs), digital signal processors (DSPs), or programmable logic devices such as programmable array logic (PAL), generic array logic (GAL), field programmable gate arrays (FPGA), or another type of computer processing device (CPD). In at least one embodiment, the data center racks 140 can include a single type of processing equipment or a combination of any of different types of processing equipment. In at least one embodiment, the processing equipment can include an analog processor.

In at least one embodiment, the processing equipment can be high-density (HD) GPU equipment that include storage nodes and high performance GPU compute nodes designed to accelerate deep learning applications. In at least one embodiment, the high performance GPU compute nodes can be processing equipment designed for general-purpose computing on graphics processing units (GPUs) to accelerate deep learning applications. In at least one embodiment, the GPU compute nodes can be processing equipment of the DGX or EGX product lines from NVIDIA Corporation of Santa Clara, California. In at least one embodiment, a version of the DGX product line, DGX-2, is used herein as one example of a GPU compute node.

In at least one embodiment, the various different types and amounts of electronic equipment needed for data centers to provide the amount of computing power being requested require a tremendous amount of power, both for the data center 100 as a whole, and on a rack-by-rack basis 140. Accordingly, each of the data center racks 140 may include a power distribution unit to distribute this tremendous amount of power. In at least one embodiment, while low-power power distribution units may be sufficient for data center racks having a power demand up to approximately 15 kVA, data center racks having a higher power demand (e.g., above 15 kVA) require power distribution units capable of providing more power. In at least one embodiment, one or more of the data center racks 140 may include novel power distribution units capable of handling the higher power demands encountered with certain data center racks, regardless of the processor type located therein.

In at least one embodiment, the data center 100 additionally includes one or more R&D clusters 160. In the illustrated embodiment, the data center 100 includes a pair of R&D clusters 160. The R&D clusters 160 are separate high power density clusters for testing of future air-cooled and/or liquid-to-chip-cooled servers.

The N independent coolable clusters 150 (e.g., the eight (8) independent coolable clusters 150 illustrated in FIG. 1), in at least one embodiment, each have an ostensible power demand ($P_{os}$) approximately equal to the given power supply $P_s$ divided by the number N, or $P_s/N$. Typically, each of the N independent coolable clusters 150 will have the same ostensible power demand ($P_{os}$). Further to this embodiment, each of the N independent coolable clusters 150 may have a respective actual power demand ($P_{ac}$), which may change over time. The respective actual power demand ($P_{ac}$), in at least on embodiment, is approximately equal to the actual power consumed (e.g., for a given period of time) for each of the independent coolable clusters 150. In at least one embodiment, the respective actual power demands ($P_{ac}$) are adjustable at, above or below the ostensible power demand ($P_{os}$), for example by placing additional electronic equipment within the data center racks 140, or alternatively taxing the existing electronic equipment at greater levels.

In accordance with at least one other embodiment, the N independent coolable clusters 150 are configured such that when a first of the N independent coolable clusters (e.g., say the first coolable cluster 150) has its actual power demand ($P_{ac}$) above the ostensible power demand ($P_{os}$), a second of the N independent coolable clusters 150 (e.g., say the second coolable cluster 150) has its actual power demand ($P_{ac}$) below the ostensible power demand ($P_{os}$). Accordingly, in at least this embodiment, a sum of the actual power demands ($P_{ac}$) for the N independent coolable clusters 150 is maintained at or below the given supply of power ($P_s$). Thus, according to this embodiment, additional needed power for one of the N independently coolable clusters 150 may be harvested and/or collected from an excess (e.g., unused or stranded power) from another of the N independently coolable clusters 150. In this sense, the N independently coolable clusters 150 may be operated in a ping-pong like nature, wherein at certain times ones of the N independently coolable clusters 150 are operated with their actual power demand ($P_{ac}$) above the ostensible power demand ($P_{os}$), while at the same time certain other ones of the ones of the N independently coolable clusters 150 are operated with their actual power demand ($P_{ac}$) below the ostensible power demand ($P_{os}$), this occurring without exceeding the given supply of power ($P_s$).

The ability to shift the allotted amount of the given supply of power ($P_s$) amongst the various N independently coolable clusters 150 to accommodate the varying actual power demand ($P_{ac}$) of the various N independently coolable clusters 150 is not so easy as to just plug in more electronic components into a given independently coolable cluster 150 and go. For instance, the data center enclosure 110 is designed for a given cooling capacity (CC), and thus the N independent coolable clusters each have a respective ostensible cooling capacity ($CC_{os}$) approximately equal to given cooling capacity (CC) divided by N, or CC/N. However, the instant data center 100 may be designed such that when the actual power demand ($P_{ac}$) of a first of the N independent coolable clusters 150 is increased above its ostensible power demand ($P_{os}$), its actual cooling capacity ($CC_{ac}$) may be increased above its ostensible cooling capacity ($CC_{os}$). Moreover, the instant data center 100 may optionally be designed such that when the actual power demand ($P_{ac}$) of a second of the N independent coolable clusters 150 is decreased below its ostensible power demand ($P_{os}$), its actual cooling capacity ($CC_{ac}$) may be decreased below its ostensible cooling capacity ($CC_{os}$).

Advantageously, in at least one embodiment, the N clusters 150 are independently coolable from one another, and thus the actual cooling capacity ($CC_{ac}$) of each of the N independently coolable clusters 150 may also be independently controlled. In at least one embodiment, the data center enclosure 110 includes a raised floor for providing airflow to the N independent coolable clusters 150, thereby assisting in the independent control of the N independently coolable clusters 150. In at least one other embodiment, at least one of a temperature, an airflow and a pressure is independently adjustable across the N independent coolable clusters of data center racks. In certain embodiments, just the temperature is independently adjustable, but in other embodiments just the airflow or the pressure is independently adjustable. In yet other embodiments, any combination of the temperature, airflow and pressure is independently adjustable. While the N clusters 150 have been discussed as being independently coolable, in certain embodiments the data center racks 140 within a given cluster 150 may be independently cooled.

Moreover, in at least one other embodiment, the N independent coolable clusters 150 each include a multimode cooling system, the multimode cooling system providing the ability to increase or decrease the respective actual cooling capacities ($CC_{ac}$) of the N independent coolable clusters above or below their ostensible cooling capacities ($CC_{os}$). In at least one embodiment, the multimode cooling system of each of the N independent coolable clusters 150 comprises an air-based cooling subsystem and a liquid-based cooling subsystem. In such an embodiment, at least one of the temperature, the airflow or the pressure may be adjusted for the air-based cooling subsystem, while the temperature and flow rate may be adjusted for the liquid-based cooling subsystem. In yet another embodiment, the multimode cooling system of each of the N independent coolable clusters 150 comprises two or more of the air-based cooling subsystem, the liquid-based cooling subsystem (e.g., immersion cooling subsystem), a phase-based cooling subsystem (e.g., a cold plate single phase cooling subsystem, cold plate two phase cooling subsystem, etc.), or a dielectric-based cooling subsystem. The liquid-based cooling subsystem may require independent supply (e.g., colder) and return (e.g., warmer) manifolds built into the N independent coolable clusters 150, as well as part of the data center racks themselves. Such independent supply (e.g., colder) and return (e.g., warmer) manifolds may include quick connects, thereby supplying the same to the N independent coolable clusters 150 and the data center racks themselves. In certain embodiments, every single rack within a given coolable cluster 150 is pre-configured for both the air-based cooling subsystem and the liquid-based cooling subsystem.

The multimode cooling systems of each of the N independently coolable clusters 150 may, therefore, be rated for different cooling capacities as each of the subsystems may have a different rated cooling capacity. In at least one embodiment, the air-based cooling subsystem is rated for between 10 kilowatt (KW or kW) to 57 KW of generated heat. Similarly, the liquid-based cooling subsystem, the phase-based cooling subsystem, and the dielectric-based cooling subsystem could be rated for between 30 KW and 120 KW of generated heat. As such, the multiple mode cooling system enables switching of different cooling system, which may be used for peak shaving and for removal of regular to extreme heat due to either computational loads or environmental conditions.

The ability to easily accommodate the various different amounts of heat generated amongst the N independently coolable clusters 150 is not the only requirement to be able to increasing and/or decreasing the actual power demand ($P_{ac}$) amongst the N independently coolable clusters 150. It is additionally necessary to distribute the increased actual power demand ($P_{ac}$) amongst the data center racks within each of the N independently coolable clusters 150. Accordingly, each of the data center racks within each of the N independently coolable clusters 150 would traditionally include one or more power distribution units. Traditional power distribution units are not capable of accommodating the increased actual power demand ($P_{ac}$) for the data center racks of the N independently coolable clusters 150. Thus, in accordance with one embodiment, certain ones of the data center racks within certain ones of the N independently coolable clusters 150 (e.g., each of the data center racks within each of the N independently coolable clusters 150) include one or more high power, power distribution units. In at least one embodiment, each of the high power, power distribution units includes a power distribution unit enclosure having a connector surface, one or more low power inlet connectors extending through the connector surface, and one or more higher power inlet connectors extending through the connector surface, wherein a ratio of a number of the one or more higher power inlet connectors to a number of the one or more low power inlet connectors is at least 1:1.

Given the foregoing, in one non-limiting use based example, the data center 100 might have a given supply of power ($P_s$) of approximately 4.5 MW. Given that the data center 100 illustrated in FIG. 1 includes eight (8) independently coolable clusters 150, each of the eight (8) coolable clusters 150 would have an ostensible power demand ($P_{os}$) approximately equal to 4.5 MW divided by eight (8), or approximately 560 kW. Likewise, in this non-limiting use-based example, each of the data center racks 140 might have an ostensible power demand ($P_{os}$) of approximately 35 kW. In accordance with the disclosure, and employing the cooling distribution and/or power distribution ideas discussed above, certain ones of the eight (8) independently coolable cluster 150 could be increased above their an ostensible power demand ($P_{os}$) of approximately 560 kW. For instance, four (4) of the eight (8) independently coolable cluster 150 could have their respective actual power demand ($P_{ac}$) adjusted to zero (e.g., they are not in operation), and the other of the four (4) independently coolable cluster 150 could have their respective actual power demand ($P_{ac}$) doubled to approximately 1120 kW each, all the while not exceeding given supply of power ($P_s$) of 4.5 MW. In another embodiment, four (4) of the eight (8) independently coolable cluster 150 could have their respective actual power demand ($P_{ac}$) adjusted to 360 kW, and the other of the four (4) independently coolable cluster 150 could have their respective actual power demand ($P_{ac}$) increased to approximately 760 kW each, all the while not exceeding given supply of power ($P_s$) of 4.5 MW. Moreover, any combination of increased actual power demand ($P_{ac}$) and decreased actual power demand ($P_{ac}$) among the eight (8) independently coolable clusters 150, so long as the sum thereof does not exceed 4.5 MW, could be employed. Similarly, it is envisioned that the actual power demand ($P_{ac}$) of the individual data center racks within each of the eight (8) independently coolable clusters 150, could also be increased and/or decreased, so long as the given supply of power ($P_s$) does not exceed 4.5 MW (e.g., in this use based example).

Figure 2:
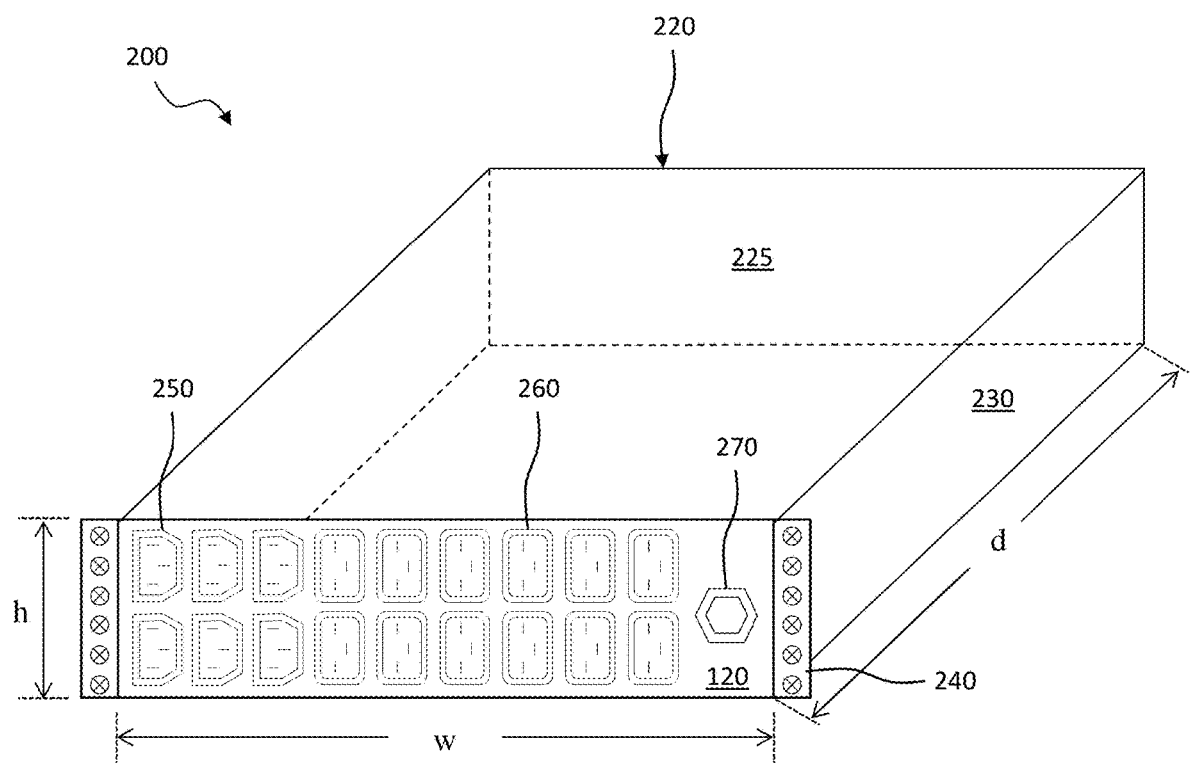
FIGS. 2-4 illustrate power distribution units (PDUs) designed, manufactured and operated according to one or more alternative embodiments of the disclosure.

FIG. 2 illustrates a power distribution unit 200 designed, manufactured and operated according to at least one embodiment of the disclosure. The power distribution unit 200 could be used as the one or more power distribution units employed in the data center racks 140 of FIG. 1, and greatly assists with the above-discussed fungible nature of the data center 100. In at least one embodiment, the power distribution unit 200 includes a power distribution unit enclosure 210. In at least one embodiment, the power distribution unit enclosure 210 includes a connector surface 220, a rear surface 225, and one or more side surfaces 230. In at least one embodiment, the connector surface 220 and rear surface 225 are defined by the width (w) and height (h), whereas the one or more side surfaces are defined by the height (h) and depth (d).

In at least one embodiment, the width (w), height (h) and depth (d) of the power distribution unit enclosure 210 may vary based upon the design of the power distribution unit 200. In at least one embodiment, nevertheless, the width (w) of the power distribution unit enclosure 210 ranges from approximately 405 mm (e.g., approximately 16 inches) to approximately 445 mm (e.g., approximately 17.5 inches), as might be used with an approximately 483 mm (e.g., approximately 19 inch) data center rack. In at least one embodiment, the width (w) of the power distribution unit enclosure 210 ranges from approximately 508 mm (e.g., approximately 20 inches) to approximately 545 mm (e.g., approximately 21.5 inches), as might be used with an approximately 584 mm (e.g., approximately 23 inch) data center rack. In at least one embodiment, such widths (w) are consistent with rack widths ($w_r$) of certain standard data center racks. In at least one embodiment, various different spacers and rack mount ears may also be used to accommodate different power distribution unit 200 widths (w).

In at least one embodiment, the height (h) of the power distribution unit enclosure 210 illustrated in FIG. 2 is described based upon a number of rack units (U). In at least one embodiment, a rack unit (U), as that term is used in the present disclosure, is equal to approximately 44.5 mm (e.g., approximately 1.75 inches). In at least one embodiment, a 1 U height (h) is equal to approximately 44.5 mm (e.g., approximately 1.75 inches), a 2 U height (h) is equal to approximately 89 mm (e.g., approximately 3.5 inches), a 3 U height (h) is equal to approximately 133.5 mm (e.g., approximately 5.25 inches), etc. In at least one embodiment, including the illustrated embodiment of FIG. 2, the power distribution unit enclosure 210 has a 2 U height (h).

In at least one embodiment, the depth (d) of the power distribution unit enclosure 210 illustrated in FIG. 2 is based upon the size of the internal components that make up the power distribution unit 200. In at least one embodiment, the depth (d) of the power distribution unit enclosure 210 is generally less than the rack depth ($d_r$) of the data center rack it is housed within, and thus in at least one embodiment less than approximately 1016 mm (e.g., approximately 40 inches), or less than approximately 915 mm (e.g., approximately 36 inches), depending on the data center rack chosen. In at least one embodiment, including the embodiment of FIG. 2, the width (w) and depth (d) are each greater than the height (h).

In at least one embodiment, rack mount ears 240 are coupled to the power distribution unit enclosure 210. In at least one embodiment, the rack mount ears 240 may include a collection of appropriately spaced holes, which align with same spaced holes in a rail system of a data center rack, for coupling the power distribution unit 200 to the data center rack. In at least one embodiment, the rack mount ears 240 may be removably coupled to the power distribution unit enclosure 210, such as shown in FIG. 2. In at least one embodiment, the rack mount ears 240 may alternatively be fixedly coupled to the power distribution unit enclosure 210. In at least one embodiment, including the embodiment of FIG. 2, the power distribution unit enclosure 210 is a 2U rack mount power distribution unit enclosure.

In at least one embodiment, including the illustrated embodiment of FIG. 2, the power distribution unit 200 includes one or more low power inlet connectors 250 and one or more higher power inlet connectors 260, each extending through the connector surface 220. In at least one embodiment, the phrases "low power" and "higher power," as used herein with respect to the connectors, are relative terms based upon their maximum current carrying capacity. In at least one embodiment, the one or more low power inlet connectors 250 accordingly have a lower maximum current carrying capacity than the one or more higher power inlet connectors 260, in many examples by 10 percent or more.

In at least one embodiment, the one or more low power inlet connectors 250 have an ampacity of about 16 amps or less. In at least one embodiment, Ampacity, as that term is used herein, is defined as the maximum current, in amperes, that a conductor can carry continuously under the conditions of use without exceeding its temperature rating (e.g., maximum pin temperature), as calculated by the National Electric Code. In at least one embodiment, such as the embodiment of FIG. 2, the one or more low power inlet connectors 250 are one or more C13 inlet connectors. In at least one embodiment, for example in the United States, C13 inlet connectors have an ampacity of about 16 amps, for a 70 degrees Celsius maximum pin temperature (e.g., 120V×60 Hz). In at least one embodiment, for example in APAC or EU, C13 inlet connectors have an ampacity of about 10 amps, for a 70 degrees Celsius maximum pin temperature (e.g., 230V×50 Hz). In at least one embodiment, the one or more C13 inlet connectors are configured to couple to or engage with an electrical power cord having a C14 end, both of which may commonly be found associated with personal computers and related peripherals.

In at least one embodiment, the one or more higher power inlet connectors 260 have an ampacity of at least about 20 amps. In at least one embodiment, such as the embodiment of FIG. 2, the one or more higher power inlet connectors 260 are one or more C19 inlet connectors. In at least one embodiment, such as in the United States, C19 inlet connectors have an ampacity of about 20 amps, for a 70 degrees Celsius maximum pin temperature (e.g., 120V×60 Hz). In at least one embodiment, such as in APAC or EU, C19 inlet connectors have an ampacity of about 16 amps, for a 70 degrees Celsius maximum pin temperature (e.g., 230V×50 Hz). In at least one embodiment, the one or more C19 inlet connectors are configured to couple to or engage with an electrical power cord having a C20 end. In at least one embodiment, C19 inlet connectors and C20 ends are common for supplying power to enterprise-class servers, uninterruptable power supplies (UPS), datacenter rack-mounted power-distribution units and other equipment that draw too much current for C13/C14 types.

In at least one embodiment, an exact number of low power inlet connectors 250 and higher power inlet connectors 260 is based upon the power demand placed upon the power distribution unit 200 designed, manufactured and operated according to the disclosure. In at least one embodiment, in contrast to existing power distribution units, the power distribution unit 200 is designed such that a ratio of a number of the one or more higher power inlet connectors 260 to a number of the one or more low power inlet connectors 250 is at least 1:1. In at least one embodiment, if there is only one low power inlet connector 250, there will also be at least one higher power inlet connector 260. In at least one embodiment, if there are only two low power inlet connectors 250, there will similarly be at least two higher power inlet connectors 260.

In at least one embodiment, the number of higher power inlet connectors 260 greatly outweighs the number of low power inlet connectors 250. In at least one embodiment, for instance, the ratio of the number of the one or more higher power inlet connectors 260 to the number of the one or more low power inlet connectors 250 is at least 3:2. In at least one embodiment, the ratio of the number of the one or more higher power inlet connectors 260 to the number of the one or more low power inlet connectors 250 is at least 2:1. In at least one embodiment, the ratio of the number of the one or more higher power inlet connectors 260 to the number of the one or more low power inlet connectors 250 is at least 3:1, or even 7:1 or greater. In at least one embodiment, such as that illustrated in FIG. 2, the power distribution unit 200 includes twelve (12) higher power inlet connectors 260 (e.g., C19 inlet connectors) and six (6) low power inlet connectors 250 (e.g., C13 inlet connectors), again within a 2 U height (h) of the power distribution unit enclosure 210.

In at least one embodiment, the one or more low power inlet connectors 250 and one or more higher power inlet connectors 260 that extend through the connector surface 220 collectively have a load power capacity of at least about 17.3 kVA. In at least one embodiment, the phrase "load power capacity," as used throughout this disclosure, refers to 80% of the maximum amount of power the power distribution unit 200 is capable of supporting, which is a value chosen in North America in an attempt to avoid circuit overload and fire risk. In at least one embodiment, a load power capacity of at least about 17.3 kVA, would in turn represent a maximum power capacity of at least about 21.6 kVA at 60 amps.

In at least one embodiment, the one or more low power inlet connectors 250 and one or more higher power inlet connectors 260 that extend through the connector surface 220 collectively have a load power capacity of at least about 23 kVA (e.g., a maximum power capacity of at least about 28.8 kVA at 80 amps), and in yet another embodiment of at least about 28.8 kVA (e.g., a maximum power capacity of at least about 36 kVA at 100 amps). In at least one embodiment, the one or more low power inlet connectors 250 and one or more higher power inlet connectors 260 that extend through the connector surface 220 collectively have a load power capacity of at least about 34.5 kVA (e.g., a maximum power capacity of at least about 43 kVA at 60 amps), and in yet another different embodiment of at least about 57.5 kVA (e.g., a maximum power capacity of at least about 71.8 kVA at 100 amps). In at least one embodiment, a power distribution unit 200 designed, manufactured and operated according to the disclosure desirably employs the most number of higher power inlet connectors 260 having the highest load power capacity within the smallest power distribution unit enclosure 210.

In at least one embodiment, the power distribution unit 200 additionally includes a main power interface 270. In at least one embodiment, the main power interface 270 is the point at which the power distribution unit 200 receives AC power from a power source. In at least one embodiment, the main power interface 270 is coupled to a bus bar of a data center rack, for example using a main power cable. In at least one embodiment, such as that illustrated in FIG. 2, the main power interface 270 is on the right hand side of the back of the power distribution unit 200 (e.g., as looking at a back thereof). In at least one embodiment, the main power interface 270 may be located on the left hand side of the back of the power distribution unit 200 (e.g., as looking at a back thereof), or alternatively the power distribution unit 200 may have the option of placing the main power interface 270 on the right or left hand side thereof. In at least one embodiment, it may be beneficial to employ a right hand side main power interface 270 on a first power distribution unit 200 located within a server rack, and a left hand side main power interface 270 on a second power distribution unit 200 located within the server rack, as doing such helps physically manage the routing of power.

In at least one embodiment, in addition to the power distribution unit 200 distributing power amongst its one or more low power inlet connectors 250 and its one or more higher power inlet connectors 260, the power distribution unit 200 may have a transformer to step down the power for certain other lower power devices. In at least one embodiment, the power distribution unit 200 may additionally have metering capabilities, including both input and output metering capabilities. In at least one embodiment, the power distribution unit 200 may additionally be a managed power distribution unit, such that a user may remotely manage its features, including inlet connector switching, and inlet connector level controlling and monitoring, among other remotely managed features.

Figure 3:
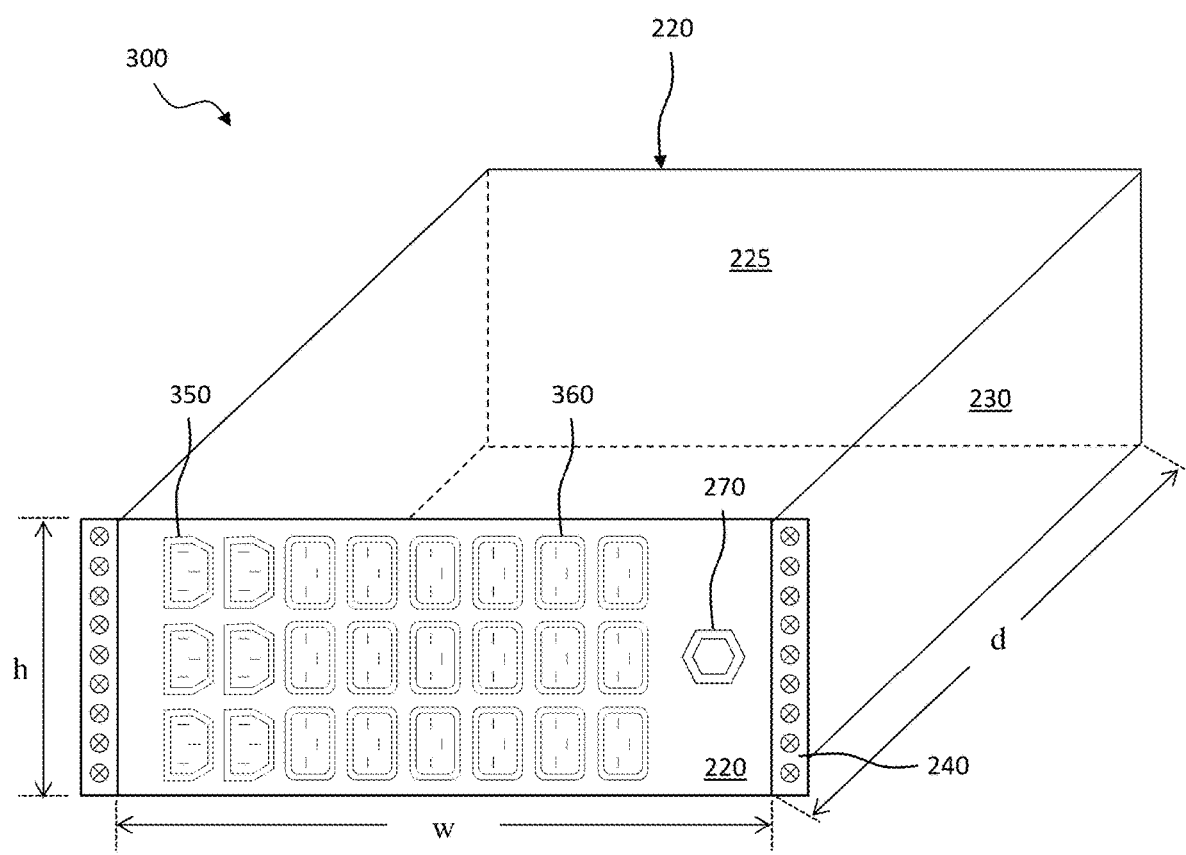

FIG. 3 illustrates a power distribution unit 300 designed, manufactured and operated according to at least on embodiment of the disclosure. In at least one embodiment, the power distribution unit 300 is similar in many respects to the power distribution unit 200 described in detail above. In at least one embodiment, like reference numbers have been used to represent similar, if not identical, features. In at least one embodiment, the power distribution unit 300 differs, for the most part, from the power distribution unit 200, in that the power distribution unit 300 has a height (h) of 3 U, and furthermore includes six (6) low power inlet connectors 350 and eighteen (18) higher power inlet connectors 360 extending through the connector surface 220. In at least one embodiment, such as the embodiment of FIG. 3, the power distribution unit 300 has a load power capacity of at least about 34.5 kVA.

Figure 4:
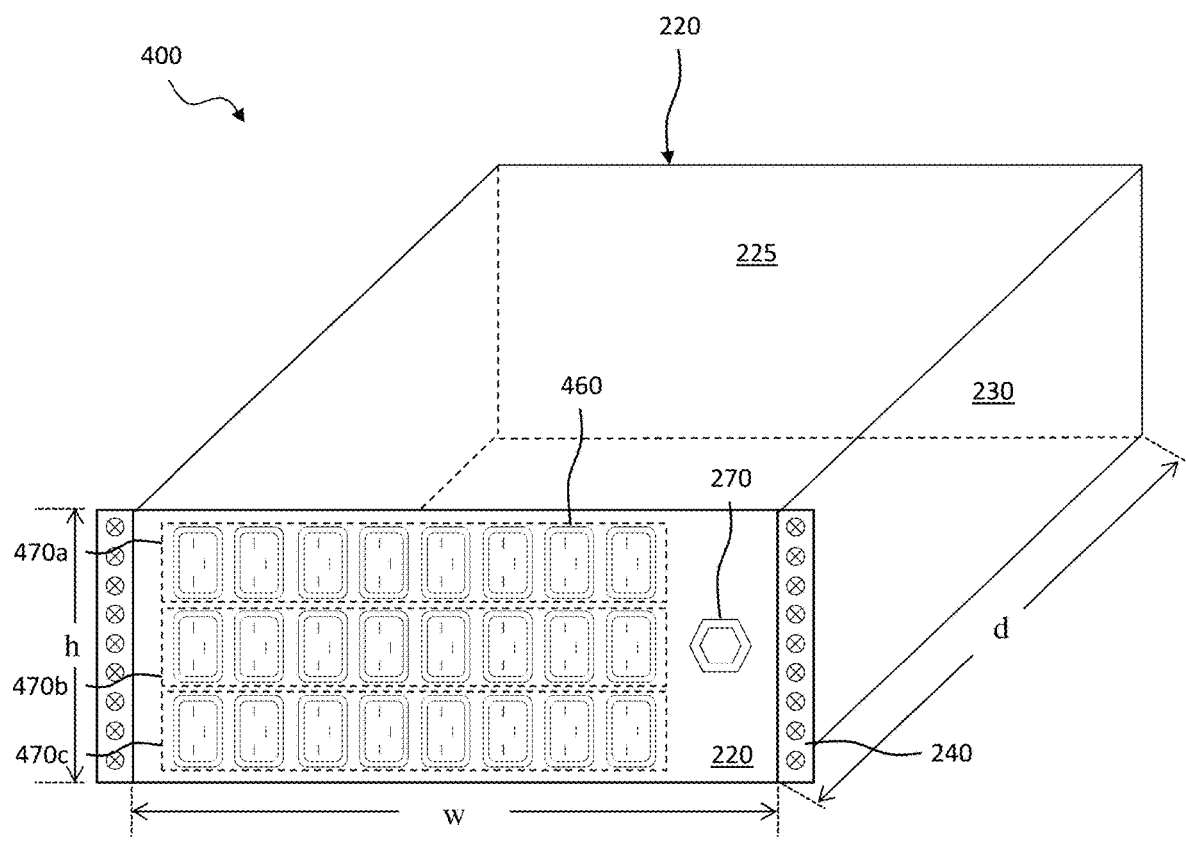

FIG. 4 illustrates a power distribution unit 400 designed, manufactured and operated according to at least one other embodiment of the disclosure. In at least one embodiment, the power distribution unit 400 is similar in many respects to the power distribution units 200, 300 described in detail above. In at least one embodiment, like reference numbers have been used to represent similar, if not identical, features. In at least one embodiment, the power distribution unit 400 differs, for the most part, from the power distribution units 200, 300, in that the power distribution unit 400 includes one or more higher power inlet connectors 460 extending through the connector surface 220, but does not include any low power inlet connectors extending through the connector surface. In at least one embodiment, the higher power inlet connectors 460 collectively have a load power capacity of at least about 17.3 kVA, if not at least about 34.5 kVA.

In at least one embodiment, the power distribution unit 400 additionally differs from the power distribution units 200, 300 in that it includes twenty-four (24) higher power inlet connectors 460 extending through the connector surface 220. In at least one embodiment, including the embodiment of FIG. 4, each of the one or more higher power inlet connectors 460 may have a maximum current carrying capacity of at least about 16 amps, such is the case if the higher power inlet connectors 460 were C19 inlet connectors.

In at least one embodiment, collections of different higher power inlet connectors 460 may be individually labeled, for example to align with different phases of the power. In at least one embodiment, the collection 470a might be color coded for a first phase of power, while collection 470b might be color coded for a second phase of power, and collection 470c might be color coded for a third phase of power. In at least one embodiment, the first collection 470a might be color coded red to indicate the first phase, the second collection 470b might be color coded black to indicate the second phase, and the third collection 470c might be color coded green to indicate the third phase. In at least one embodiment, the color coding may be applied using paint, stickers, or another readily visible indicator, and may be used with any power distribution unit manufactured according to the disclosure.

Figure 5:
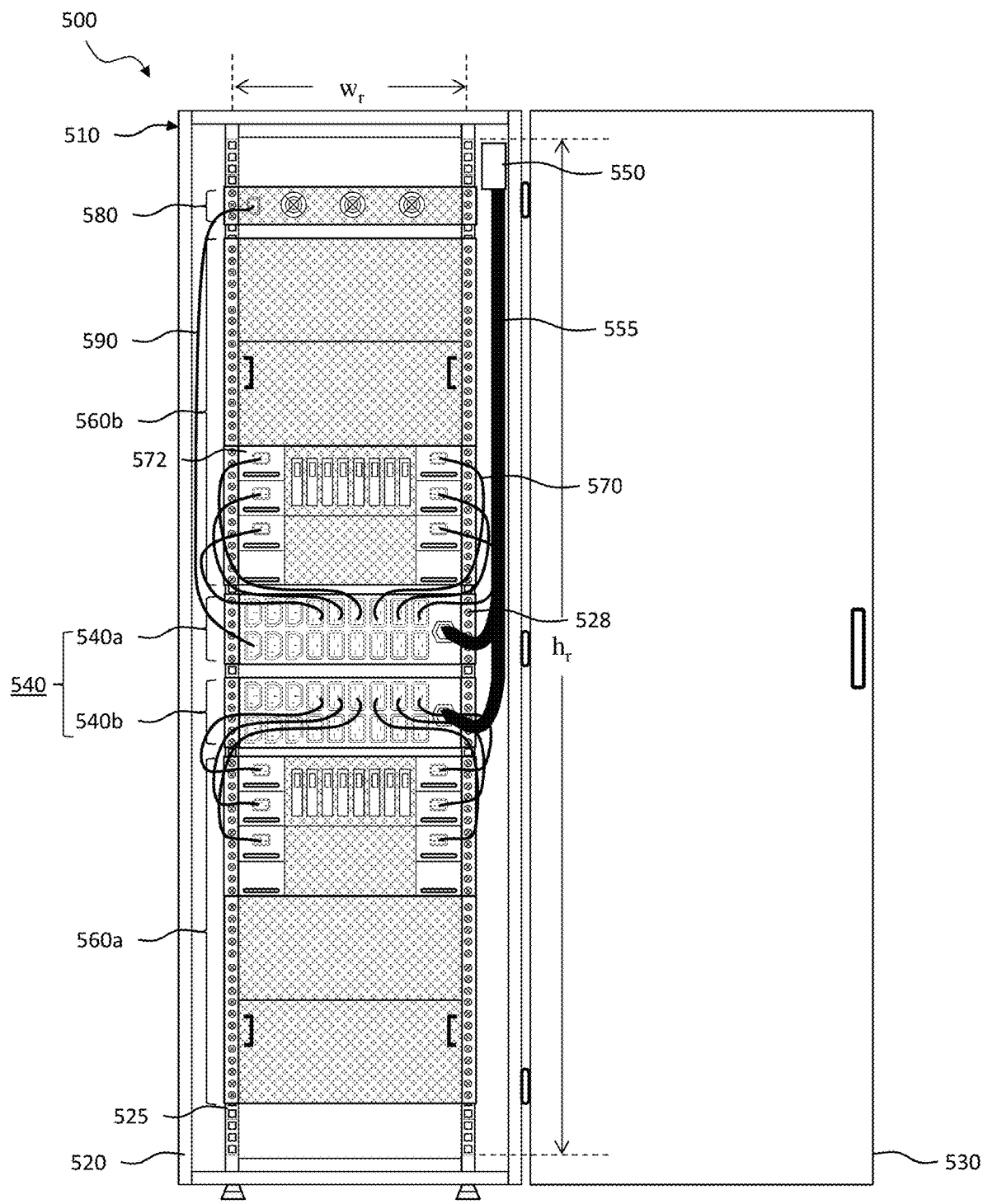
FIG. 5 illustrates a data center rack designed, manufactured and operated according to one or more alternative embodiments of the disclosure.

FIG. 5 illustrates a data center rack 500 designed, manufactured and operated according to at least one embodiment of the present disclosure. The data center rack 500 may be similar to any one of the data center racks 140 in the N independent coolable clusters 150, as described above with regard to FIG. 1, and remain within the scope of the disclosure. In at least one embodiment, the data center rack 500 includes a rack enclosure 510. In at least one embodiment, the rack enclosure 510 may be a standard Electronic Industries Alliance (EIA) rack enclosure, among others, and remain within the purview of the disclosure. In at least one embodiment, the rack enclosure 510 includes an enclosure 520, a rail system 525 located within the enclosure 520, and an optional door 530.

In at least one embodiment, the rack enclosure 510 has a rack width ($w_r$), a rack height ($h_r$) and a rack depth ($d_r$) (not illustrated), which may be defined by the rail system 525. In at least one embodiment, while not limited to such, the rack enclosure 510 employs a width ($w_r$) of either approximately 483 mm (e.g., approximately 19 inches) or approximately 584 mm (e.g., approximately 23 inches). In at least one embodiment, the rack enclosure 510 employs a height ($h_r$) of approximately 1246 mm (e.g., 28 U—approximately 49 inches), approximately 1778 mm (e.g., 40 U—approximately 70 inches), approximately 1867 mm (e.g., 42 U—approximately 73.5 inches), approximately 2000 mm (e.g., 45 U—approximately 78.75 inches), or approximately 2134 mm (e.g., 48 U—approximately 84 inches). In at least one embodiment, the rack height ($h_r$) is at least twenty-eight rack units (28 U), and the rack width ($w_r$) is at least approximately 480 mm. In at least one embodiment, the depth ($d_r$) of the data center rack often varies, for example depending on the equipment that will be housed within the rack enclosure 510.

In at least one embodiment, including the embodiment of FIG. 5, one or more power distribution units 540 are physically coupled to the rack enclosure 510. In at least one embodiment, a first power distribution unit 540a and a second power distribution unit 540b are physically coupled to the rack enclosure 510. In at least one embodiment, such as the embodiment of FIG. 5, the power distribution units 540a, 540b are fixed within the rail system 525 using one or more fasteners 528. In at least one embodiment, the power distribution units 540a, 540b may be any power distribution unit designed, manufactured and operated according to the present disclosure. In at least one embodiment, the power distribution units 540a, 540b are similar, if not identical, to one or the other of the power distribution units 200, 300, 400 illustrated above with regard to FIGS. 2-4. In at least one embodiment, the power distribution units 540a, 540b would each include a power distribution unit enclosure having a connector surface, one or more low power inlet connectors extending through the connector surface, and one or more higher power inlet connectors extending through the connector surface, as described above. In at least one embodiment, a ratio of the number of the one or more higher power inlet connectors to the number of the one or more low power inlet connectors for each of the power distribution units 540a, 540b is at least 1:1. In at least one embodiment, the one or more low power inlet connectors and one or more higher power inlet connectors, for each of the power distribution units 540a, 540b, may collectively have a load power capacity of at least about 17.3 kVA.

In at least one embodiment, the power distribution units 540a, 540b are coupled to a main power source 550 using one or more main power cables 555, which may each in turn employ an IED 60309 plug at an end of the main power cable 555 opposite the power distribution units 540a, 540b. In at least one embodiment, the main power source 550 is a bus bar located within the enclosure 520. In at least one embodiment, the main power source 550 comprises a different feature than a bus bar. In at least one embodiment, the main power cables 555 extend between the main power source 550 and a main power interface of the power distribution units 540a, 540b.

In at least one embodiment, the power distribution units 540a, 540b are positioned within about 25 percent of a vertical midpoint (e.g., as defined by a midpoint of height ($h_r$)) of the rail system 525. In at least one embodiment, the power distribution units 540a, 540b are positioned within about 10 percent of the vertical midpoint of the rail system 525, and in even yet at least one other embodiment within about 5 percent of the vertical midpoint of the rail system 525. In at least one embodiment, such a position may allow the power distribution units 540a, 540b to be substantially equal distance from any electronics above and below them in the rail system 525.

In at least one embodiment, the data center rack 500 additionally includes a first data server 560a and a second data server 560b physically coupled to the rack enclosure 510. In at least one embodiment, one or both of the first and second data servers 560a, 560b may be CPU data servers. In at least one embodiment, one or both of the first and second data servers 560a, 560b may be GPU data servers. In at least one embodiment, one or both of the first and second data servers 560a, 560b may be data servers that include other types of processors, including application-specific integrated circuits (ASICs), digital signal processors (DSPs), or programmable logic devices such as programmable array logic (PAL), generic array logic (GAL), field programmable gate arrays (FPGA), or another type of computer processing device (CPD). In at least one embodiment, the first and second data servers 560a, 560b, may be a collection of CPU, GPU, and other data servers including the aforementioned processors. In at least one embodiment, one or both of the first and second data servers 560a, 560b may be GPU data servers from the DGX product line from NVIDIA. In at least one embodiment, including the illustrated embodiment of FIG. 5, both the first and second data servers 560a, 560b are DGX-2 GPU data servers, as might be obtained from NVIDIA. In at least one embodiment, unless otherwise indicated, the present disclosure should not be limited to CPU or GPU data servers, and moreover should not be limited to any specific manufacturer thereof.

In at least one embodiment, including in the embodiment of FIG. 5, the first and second data servers 560a, 560b are fixed within the rail system 525 using the one or more fasteners 528. In at least one embodiment, the first and second data servers 560a, 560b are additionally electrically coupled to the power distribution units 540a, 540b. In at least one embodiment, one or more server power cords 570 couple higher power inlet connectors of the power distribution units 540a, 540b to higher power inlet connectors of the first and second data servers 560a, 560b.

In at least one embodiment, the data center rack 500 additionally includes a low power peripheral device 580 physically coupled to the rack enclosure 510. In at least one embodiment, the low power peripheral device is fixed within the rail system 525 using the one or more fasteners 528. In at least one embodiment, the low power peripheral device 580 is additionally electrically coupled to one or more of the power distribution units 540a, 540b. In at least one embodiment, a power cord 590 couples a low power inlet connector of the power distribution unit 540a to a low power inlet connector of the low power peripheral device 580. In at least one embodiment, the low power peripheral device 580 may comprise many different devices and remain within the scope of the disclosure. In at least one embodiment, the low power peripheral device 580 is a low power cooling device.

In at least one embodiment, the power distribution units, such as the power distribution units 540a, 540b, are particularly advantageous when used in a rack enclosure 510 along with one or more data servers. In at least one embodiment, such a design reduces the overall airflow impedance of the data center rack 500, and thus provides improved cooling characteristics. In at least one embodiment, the rack mount power distribution units 540a, 540b, in contrast to strip mounted power distribution units, additionally allow the power supplies 572 of the first and second data servers 560a, 560b to be easily replaced, for example by sliding them out of the first and second data servers 560a, 560b while the first and second data servers 560a, 560b remain fixed within the rail system 525. In at least one embodiment, for instance in at least one typical strip mounted power distribution unit design, the strip mounted power distribution unit substantially impedes the removal of the power supplies 572, whereas the rack mount power distribution units 540a, 540b do not.

Additional details for the power distribution unit, as well as a data center rack, as might be used in the data center 100 illustrated in FIG. 1, are disclosed in U.S. patent application Ser. No. 16/798,790, entitled "POWER DISTRIBUTION UNIT," filed Feb. 24, 2020, which is commonly assigned herewith, the entirety of which is incorporated herein by reference.

Aspects disclosed herein include:

A. A data center, the data center including: 1) a data center enclosure, the data center enclosure designed for a given supply of power ($P_s$); and N independent coolable clusters of data center racks located within the data center enclosure, wherein N is at least two, and further wherein the N independent coolable clusters each have an ostensible power demand ($P_{os}$) approximately equal to $P_s/N$, and each of the N independent coolable clusters has a respective actual power demand ($P_{ac}$) adjustable at, above or below the ostensible power demand ($P_{os}$).

B. A method for cooling a data center, the method including: 1) providing a data center, the data center including: a) a data center enclosure, the data center enclosure designed for a given supply of power ($P_s$); and b) N independent coolable clusters of data center racks located within the data center enclosure, wherein N is at least two, and further wherein the N independent coolable clusters each have an ostensible power demand ($P_{os}$) approximately equal to $P_s/N$, and each of the N independent coolable clusters has a respective actual power demand ($P_{ac}$) adjustable at, above or below the ostensible power demand ($P_{os}$); and 2) increasing an actual power demand ($P_{ac}$) of a first of the N independent coolable clusters above the ostensible power demand ($P_{os}$), and decreasing an actual power demand ($P_{ac}$) of a second of the N independent coolable clusters below the ostensible power demand ($P_{os}$).

C. A data center, the data center including: 1) a data center enclosure, the data center enclosure designed for a given supply of power ($P_s$); and 2) N independent coolable clusters of data center racks located within the data center enclosure, wherein N is at least two, and further wherein at least one of a temperature, an airflow and a pressure is independently adjustable across the N independent coolable clusters of data center racks.

D. A method for cooling a data center, the method including: 1) providing a data center, the data center including: a) a data center enclosure, the data center enclosure designed for a given supply of power ($P_s$); and b) N independent coolable clusters of data center racks located within the data center enclosure, wherein N is at least two; and 2) independently adjusting at least one of a temperature, an airflow and a pressure across the N independent coolable clusters of data center racks.

Aspects A, B, C and D may have one or more of the following additional elements in combination: Element 1: wherein the N independent coolable clusters are configured such that when a first of the N independent coolable clusters has its actual power demand ($P_{ac}$) above the ostensible power demand ($P_{os}$), a second of the N independent coolable clusters has its actual power demand ($P_{ac}$) below the ostensible power demand ($P_{os}$) in order to keep a sum of the actual power demands ($P_{ac}$) for the N independent coolable clusters at or below the given supply of power ($P_s$). Element 2: wherein the data center enclosure is designed for a given cooling capacity (CC), and wherein the N independent coolable clusters each have a respective ostensible cooling capacity ($CC_{os}$) approximately equal to CC/N, and further wherein the first of the N independent coolable clusters is configured such that when its actual power demand ($P_{ac}$) is above the ostensible power demand ($P_{os}$) its actual cooling capacity ($CC_{ac}$) is increased above its ostensible cooling capacity ($CC_{os}$). Element 3: wherein the second of the N independent coolable clusters is configured such that when its actual power demand ($P_{ac}$) is below the ostensible power demand ($P_{os}$) its actual cooling capacity ($CC_{ac}$) is decreased below the ostensible cooling capacity ($CC_{os}$). Element 4: wherein the N independent coolable clusters each include a multimode cooling system, the multimode cooling system providing the ability to increase or decrease the respective actual cooling capacities ($CC_{ac}$) of the N independent coolable clusters above or below their ostensible cooling capacities ($CC_{os}$). Element 5: wherein the multimode cooling system of each of the N independent coolable clusters comprises an air-based cooling subsystem and a liquid-based cooling subsystem. Element 6: wherein the data center enclosure includes a raised floor for providing airflow to the N independent coolable clusters. Element 7: wherein N is at least four, and each of the at least four independent coolable clusters includes at least 8 data center racks. Element 8: wherein each of the data center racks within the N independent coolable clusters includes one or more data servers coupled to a respective power distribution unit. Element 9: wherein one or more of the power distribution units includes: a power distribution unit enclosure having a connector surface; one or more low power inlet connectors extending through the connector surface; and one or more higher power inlet connectors extending through the connector surface, wherein a ratio of a number of the one or more higher power inlet connectors to a number of the one or more low power inlet connectors is at least 1:1. Element 10: wherein the data center enclosure is designed for a given cooling capacity (CC), and wherein the N independent coolable clusters each have a respective ostensible cooling capacity ($CC_{os}$) approximately equal to CC/N, and further wherein each of the N independent coolable clusters are configured such that their actual cooling capacity ($CC_{ac}$) may be increased above or decreased below their ostensible cooling capacity ($CC_{os}$). Element 11: wherein the multimode cooling system of each of the N independent coolable clusters comprises an air-based cooling subsystem that at least one of the temperature, the airflow or the pressure may be adjusted, and a liquid-based cooling subsystem. Element 12: wherein the liquid-based cooling subsystem is a cold plate single phase cooling subsystem, a cold plate two phase cooling subsystem, or an immersion cooling subsystem. Element 13: wherein the N independent coolable clusters each have an ostensible power demand ($P_{os}$) approximately equal to $P_s/N$, and each of the N independent coolable clusters has a respective actual power demand ($P_{ac}$) adjustable at, above or below the ostensible power demand ($P_{os}$). Element 14: further including including keeping a sum of the actual power demands ($P_{ac}$) for the N independent coolable clusters at or below the given supply of power ($P_s$) when increasing and decreasing. Element 15: wherein the data center enclosure is designed for a given cooling capacity (CC), and wherein the N independent coolable clusters each have an ostensible cooling capacity ($CC_{os}$), and further including increasing an actual cooling capacity ($CC_{ac}$) of the first of the N independent coolable clusters above its ostensible cooling capacity ($CC_{os}$) when its actual power demand ($P_{ac}$) is increased above the ostensible power demand ($P_{os}$). Element 16: further including decreasing an actual cooling capacity ($CC_{ac}$) of the second of the N independent coolable clusters below the ostensible cooling capacity ($CC_{os}$) when its actual power demand ($P_{ac}$) is decreased below the ostensible power demand ($P_{os}$). Element 17: wherein the N independent coolable clusters each include a multimode cooling system, and further wherein the increasing and decreasing of the respective actual cooling capacities ($CC_{ac}$) includes increasing and decreasing the respective actual cooling capacities ($CC_{ac}$) using the multimode cooling systems. Element 18: wherein the data center enclosure is designed for a given cooling capacity (CC), and wherein the N independent coolable clusters each have a respective ostensible cooling capacity ($CC_{os}$) approximately equal to CC/N, and further wherein each of the N independent coolable clusters has a respective ostensible cooling capacity ($CC_{os}$), and further including adjusting an actual cooling capacity ($CC_{ac}$) of one or more of the N independent coolable clusters relative to their ostensible cooling capacity ($CC_{os}$). Element 19: wherein adjusting the actual cooling capacity ($CC_{ac}$) includes increasing or decreasing the actual cooling capacity ($CC_{ac}$). Element 20: wherein the N independent coolable clusters each include a multimode cooling system, and further including adjusting the actual cooling capacity ($CC_{ac}$) of the one or more of the N independent coolable clusters using the multimode cooling system. Element 21: wherein the N independent coolable clusters each have an ostensible power demand ($P_{os}$) approximately equal to $P_s/N$, and further including adjusting an actual power demand ($P_{ac}$) of one or more of the N independent coolable above or below the ostensible power demand ($P_{os}$).

Those skilled in the art to which this application relates will appreciate that other and further additions, deletions, substitutions and modifications may be made to the described embodiments.

What is claimed is:

1. A data center, comprising:
    a data center enclosure, the data center enclosure designed for a given supply of power ($P_s$); and
    N independent coolable clusters of data center racks located within the data center enclosure, wherein N is at least two, and further wherein the N independent coolable clusters each have an ostensible power demand ($P_{os}$) approximately equal to $P_s/N$, and each of the N independent coolable clusters has a respective actual power demand ($P_{ac}$) adjustable at, above or below the ostensible power demand ($P_{os}$).

2. The data center as recited in claim 1, wherein the N independent coolable clusters are configured such that when a first of the N independent coolable clusters has its actual power demand ($P_{ac}$) above the ostensible power demand ($P_{os}$), a second of the N independent coolable clusters has its actual power demand ($P_{ac}$) below the ostensible power demand ($P_{os}$) in order to keep a sum of the actual power demands ($P_{ac}$) for the N independent coolable clusters at or below the given supply of power ($P_s$).

3. The data center as recited in claim 2, wherein the data center enclosure is designed for a given cooling capacity (CC), and wherein the N independent coolable clusters each have a respective ostensible cooling capacity ($CC_{os}$) approximately equal to CC/N, and further wherein the first of the N independent coolable clusters is configured such that when its actual power demand ($P_{ac}$) is above the ostensible power demand ($P_{os}$) its actual cooling capacity ($CC_{ac}$) is increased above its ostensible cooling capacity ($CC_{os}$).

4. The data center as recited in claim 3, further wherein the second of the N independent coolable clusters is configured such that when its actual power demand ($P_{ac}$) is below the ostensible power demand ($P_{os}$) its actual cooling capacity ($CC_{ac}$) is decreased below the ostensible cooling capacity ($CC_{os}$).

5. The data center as recited in claim 3, wherein the N independent coolable clusters each include a multimode cooling system, the multimode cooling system providing the ability to increase or decrease the respective actual cooling capacities ($CC_{ac}$) of the N independent coolable clusters above or below their ostensible cooling capacities ($CC_{os}$).

6. The data center as recited in claim 5, wherein the multimode cooling system of each of the N independent coolable clusters comprises an air-based cooling subsystem and a liquid-based cooling subsystem.

7. The data center as recited in claim 1, wherein the data center enclosure includes a raised floor for providing airflow to the N independent coolable clusters.

8. The data center as recited in claim 1, wherein N is at least four, and each of the at least six independent coolable clusters includes at least 8 data center racks.

9. The data center as recited in claim 1, wherein each of the data center racks within the N independent coolable clusters includes one or more data servers coupled to a respective power distribution unit.

10. The data center as recited in claim 9, wherein one or more of the power distribution units includes:
    a power distribution unit enclosure having a connector surface;
    one or more low power inlet connectors extending through the connector surface; and
    one or more higher power inlet connectors extending through the connector surface, wherein a ratio of a number of the one or more higher power inlet connectors to a number of the one or more low power inlet connectors is at least 1:1.

11. A method for cooling a data center, comprising:
    providing a data center, the data center including:
        a data center enclosure, the data center enclosure designed for a given supply of power ($P_s$); and
        N independent coolable clusters of data center racks located within the data center enclosure, wherein N is at least two, and further wherein the N independent coolable clusters each have an ostensible power demand ($P_{os}$) approximately equal to $P_s/N$, and each of the N independent coolable clusters has a respective actual power demand ($P_{ac}$) adjustable at, above or below the ostensible power demand ($P_{os}$); and
    increasing an actual power demand ($P_{ac}$) of a first of the N independent coolable clusters above the ostensible power demand ($P_{os}$), and decreasing an actual power demand ($P_{ac}$) of a second of the N independent coolable clusters below the ostensible power demand ($P_{os}$).

12. The method as recited in claim 11, further including keeping a sum of the actual power demands ($P_{ac}$) for the N independent coolable clusters at or below the given supply of power ($P_s$) when increasing and decreasing.

13. The method as recited in claim 12, wherein the data center enclosure is designed for a given cooling capacity (CC), and wherein the N independent coolable clusters each have an ostensible cooling capacity ($CC_{os}$), and further including increasing an actual cooling capacity ($CC_{ac}$) of the first of the N independent coolable clusters above its ostensible cooling capacity ($CC_{os}$) when its actual power demand ($P_{ac}$) is increased above the ostensible power demand ($P_{os}$).

14. The method as recited in claim 13, further including decreasing an actual cooling capacity ($CC_{ac}$) of the second of the N independent coolable clusters below the ostensible cooling capacity ($CC_{os}$) when its actual power demand ($P_{ac}$) is decreased below the ostensible power demand ($P_{os}$).

15. The method as recited in claim 14, wherein the N independent coolable clusters each include a multimode cooling system, and further wherein the increasing and decreasing of the respective actual cooling capacities ($CC_{ac}$) includes increasing and decreasing the respective actual cooling capacities ($CC_{ac}$) using the multimode cooling systems.

16. The method as recited in claim 15, wherein the multimode cooling system of each of the N independent coolable clusters comprises an air-based cooling subsystem and a liquid-based cooling subsystem.

17. The method as recited in claim 11, wherein the data center enclosure includes a raised floor for providing airflow to the N independent coolable clusters.

18. The method as recited in claim 11, wherein N is at least six, and each of the at least six independent coolable clusters includes at least 12 data center racks.

19. The method as recited in claim 11, wherein each of the data center racks within the N independent coolable clusters includes one or more data servers coupled to a respective power distribution unit.

20. The method as recited in claim 19, wherein one or more of the respective power distribution units includes:
- a power distribution unit enclosure having a connector surface;
- one or more low power inlet connectors extending through the connector surface; and
- one or more higher power inlet connectors extending through the connector surface, wherein a ratio of a number of the one or more higher power inlet connectors to a number of the one or more low power inlet connectors is at least 1:1.

* * * * *